United States Patent [19]

Butt

[11] Patent Number: 4,827,377
[45] Date of Patent: May 2, 1989

[54] MULTI-LAYER CIRCUITRY

[75] Inventor: Sheldon H. Butt, Godfrey, Ill.

[73] Assignee: Olin Corporation, New Haven, Conn.

[21] Appl. No.: 413,046

[22] Filed: Aug. 30, 1982

[51] Int. Cl.⁴ .............................................. H05K 1/18
[52] U.S. Cl. .................... 361/401; 361/388; 361/402; 361/412
[58] Field of Search ................ 361/414, 401, 386, 388

[56] References Cited

U.S. PATENT DOCUMENTS

| | | | |
|---|---|---|---|
| 3,296,099 | 1/1967 | Dinella | 174/68.5 X |
| 3,875,478 | 4/1975 | Capstick | 361/386 X |
| 4,109,054 | 8/1978 | Burgyan | 428/433 |
| 4,385,202 | 5/1983 | Spinelli et al. | |
| 4,491,622 | 1/1985 | Butt | 428/632 |

OTHER PUBLICATIONS

"Ceramic Glossary, 1984" by Walter W. Perkins, published by The American Ceramic Society, Inc.

Primary Examiner—R. R. Kucia
Attorney, Agent, or Firm—Gregory S. Rosenblatt; Paul Weinstein

[57] ABSTRACT

Multi-layer circuitry incorporating electronic elements is disclosed. The circuitry comprises a plurality of layers including a metal or alloy substrate formed with a recess on one surface. An electronic element is positioned within the recess and a second electronic element is positioned on the surface. Also, a first dielectric material layer is disposed on the surface. Further, a first layered conductive circuit pattern overlies the first dielectric material layer so as to provide circuitry over a substantial portion of the substrate. The first circuit pattern is electrically connected to the first electronic element. The first circuit pattern also has a cavity therein for receiving the second electronic element. A second layered conductive pattern overlies at least a portion of the first layered conductive circuit pattern and the second electronic element and is electrically connected to the second electronic element. A second dielectric material layer is disposed between the first and second layered conductive circuit patterns so that these circuit patterns are bonded to and isolated from each other.

15 Claims, 2 Drawing Sheets

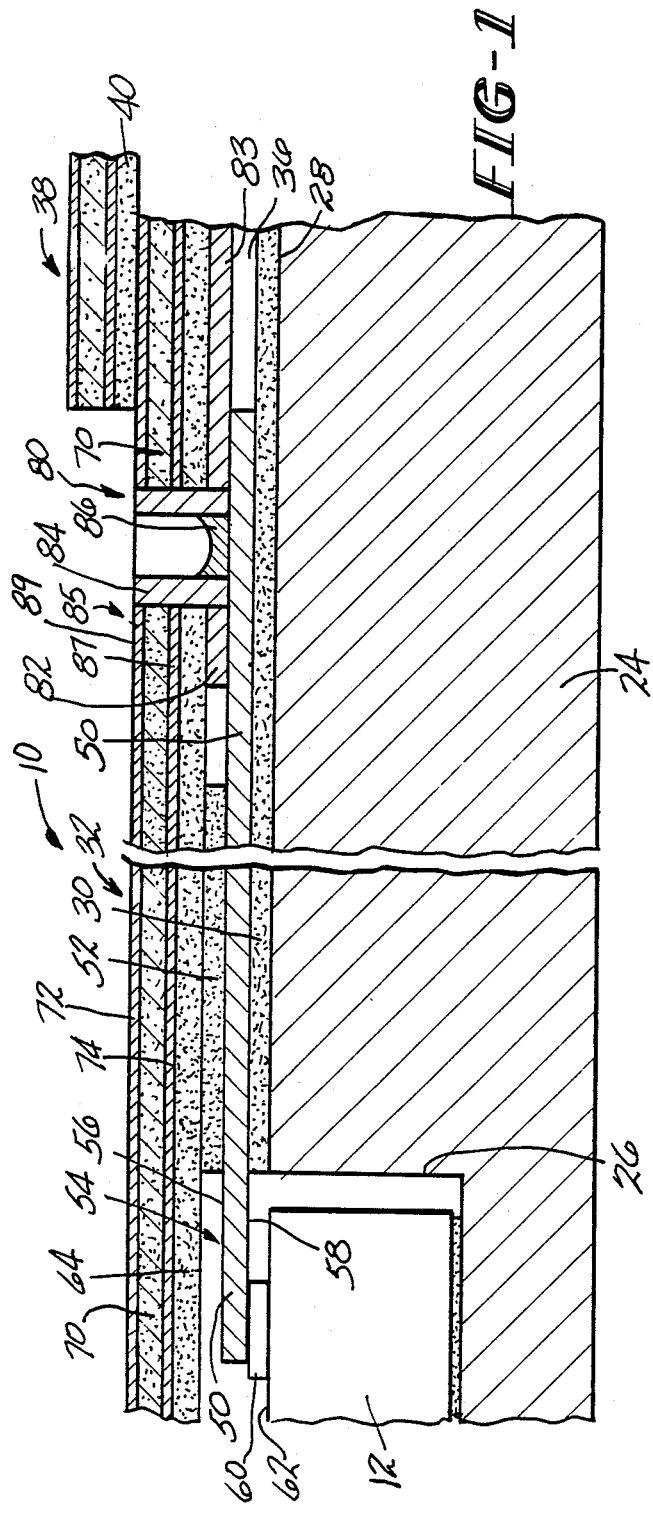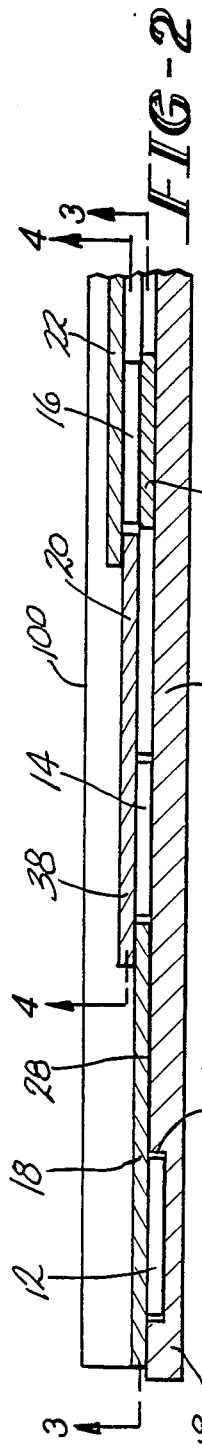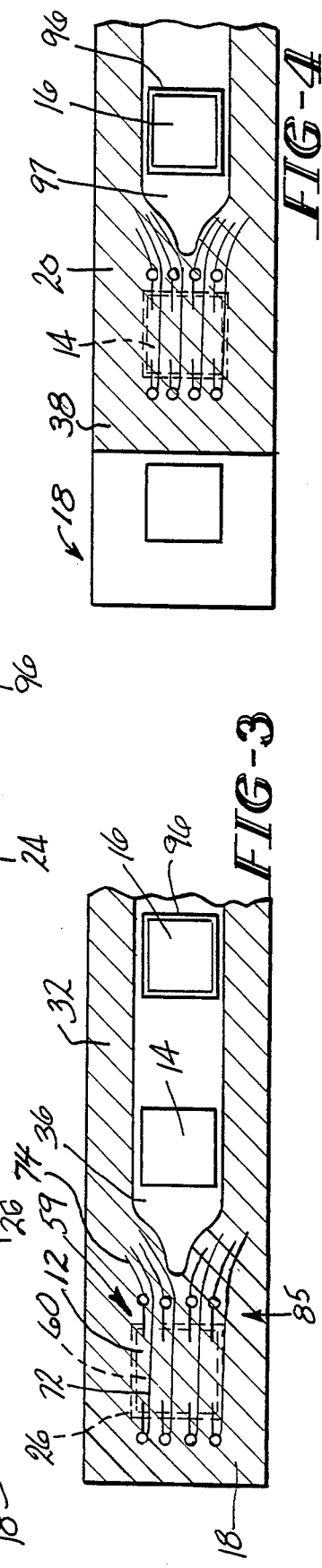

MULTI-LAYER CIRCUITRY

While the invention is subject to a wide range of applications, it is especially suited for use in high density, printed circuit board applications and will be particularly described in that connection.

Fundamentally, a printed circuit (PC) board with the semiconductors and/or other components mounted upon it (such as resistors, capacitors, switches, etc.) may be considered a system. The PC board system may be a subsystem of a device such as a computer. This exemplary computer may include one or more PC board systems, memory devices such as rotating discs coated with magnetic materials or magnetic tape, and peripheral input-output devices.

In the exemplary PC board system, the active functions of data processing, control or logic and memory are all provided by a semiconductor chip. The standard terminology usually speaks of the semiconductor chips as active components while the others are termed passive components. The passive components perform auxiliary functions which are either impractical to incorporate on the chip or at least more advantageously placed off the chip. By not considering the passive components, we may characterize everything else on the PC board as simply an elaborate means of interconnecting chips to each other and to the outside world. Thus, PC boards and lead frames are simply means of interconnection. For that matter, the semiconductor chip itself (unless it is a single discrete device) also contains interconnections. The chip primarily operates to interconnect the individual functions of the chip. For example, a 64,000 bit memory chip contains not only 64,000 memory cells (transistors) but also the maze of interconnections between them and the circuitry and logic used in accessing them. Theoretically, one could use 64,000 individual transistors plus a comparable number of other components and a number of elaborate PC boards to perform the same function as the individual chip. Of course, the cost would be enormously higher and because of the much greater distances separating individual components would perform exceedingly slower.

A convenient means of referring to interconnections which avoids ambiguities of the sort referred to in comparing the 64K memory chip to 64,000 transistors is to think in terms of levels of interconnection. The first level, of only indirect concern in the present invention, is the interconnections on the chip itself. The second level is the primary interconnection to the chip which is characteristically either a small diameter lead wire or the equivalent, a Tape Automated Bonding (TAB) component. The third level is the interconnection from the second level to the PC board. Typically, this is the lead frame or its equivalent in the form of a conductive pattern on a leadless chip carrier. The fourth level of interconnection is the PC board itself.

There are instances in which one or another of these levels may in turn be split. For example, a socket may be inserted into the PC board and the lead frame inserted into the socket. Another example is mounting several chips in a single hybrid package and interconnecting them together within the package (a function which would otherwise be provided by the PC board itself). Then, the hybrid package itself is connected to the PC board.

There ar also instances in which two levels may be combined; for example, mounting a chip directly upon a PC board without interconnection through a lead frame. A common example of eliminating this third interconnection level is illustrated in certain electronic watches. There the chip is mounted directly upon a tiny flexible PC board without an intervening lead frame in order to save space. The watch case is relied upon to protect the chip rather than the usual technique of protecting the chip by a package.

Superficially, it might seem logical to connect the chip directly to the circuitry on the PC board, eliminating both the lead wires (second level interconnections) and the lead frame (third level interconnections). There would be far fewer interconnections to fail or cause problems and a cost savings should also result.

Directly connecting a chip to a PC board has been done on a very limited basis. For example, multiple layers of ceramics have replaced "conventional" multilayer PC boards. The interconnection patterns normally formed on a PC board by etching copper foil are replaced by printed thick film conductor paths fired and fused onto the ceramics. Then, chips are mounted upon these thick film conductor circuits. Eliminating the second and third levels of interconnection by this technique is expensive and cumbersome. The ceramic components are expensive and must be relatively thick due to their relative fragility. Further, since the thermal dissipation characteristics of the resulting assembly are relatively poor, expensive, complex and often cumbersome devices are required for removing generated heat.

Examples of connections in multi-layer circuits are disclosed in U.S. Pat. No. 3,250,848 to Beelitz et al. and in U.S. Pat. No. 3,549,784 to Hargis.

A method of mounting a component in a printed circuit board is disclosed in U.S. Pat. No. 3,480,836 to Aronstein and in U.S. Pat. No. 3,739,232 to Grossman et al.

It is also known within the art to provide interconnected electrical circuit components as disclosed in U.S. Pat. Nos. 3,351,816 to Sear et al., 4,225,900 to Ciccio et al. and 4,320,438 to Ibrahim et al.

U.S. Pat. No. 3,546,363 to Pryor et al. discloses a composite metal product for use as a seal to glasses and ceramics which has properties of a low coefficient of expansion, approximating that of the appropriate glasses and ceramics, good thermal conductivity, and fine grain size in the annealed condition.

U.S. Pat. Nos. 3,546,363; 3,618,203; 3,676,292; 3,726,987; 3,726,627; 3,826,629;, 3,837,895; 3,852,148; and 4,149,910 disclose glass or ceramic to metal composites or seals wherein the glass or ceramic is bonded to a base alloy having a thin film of refractory oxide on its surface.

U.S. patent application Ser. No. 261,330, filed May 7, 1981 to Butt et al. discloses for example, "a process for thermosonically bonding leadwires to leadframes having a thin refractory oxide layer."

U.S. patent application Ser. No. 341,392, filed Jan. 19, 1982 to Butt discloses for example, "a highly reliable metal casing which is sealed and bonded using an adhesive."

U.S. patent application Ser. No. 390,081, filed June 21, 1982 to Butt discloses for example, "a semiconductor package by itself or mounted on a circuit board which can accommodate substantial thermal cycling."

It is a problem underlying the present invention to provide multi-layer circuitry requiring less space and interconnections than known in the prior art.

It is an advantage of the present invention to provide multi-layer circuitry which eliminates at least one level of interconnections in a relatively easy to manufacture and inexpensive manner.

It is a further advantage of the present invention to provide multi-layer circuitry which is adapted for efficient heat removal.

It is a still further advantage of the present invention to provide multi-layer circuitry which decreases the length of interconnection paths and potentially increases the functional speed of the circuitry.

Accordingly, there has been provided multi-layer circuitry incorporating electronic elements. The circuitry comprises a plurality of layers including a metal or alloy substrate. The substrate is formed with a recess on one surface having an electronic element positioned therein and a second electronic element is positioned on the surface. Also, a first dielectric material layer is disposed on the surface. Further, a first layered conductive circuit pattern overlies the first dielectric material layer so as to provide circuitry over a substantial portion of the substrate. The first circuit pattern is electrically connected to the first electronic element. The first circuit pattern also has a cavity therein for accommodating the second electronic element. A second layered conductive circuit pattern overlies the first layered conductive circuit pattern and the second electronic element and is electrically connected to the second electronic element. A second dielectric material layer is disposed between the first and second layered conductive circuit patterns so that these circuit patterns are bonded to and isolated from each other.

The invention and further developments of the invention are now elucidated by means of preferred embodiments shown in the drawings:

FIG. 1 is a side view in cross section of multi-layer circuitry in accordance with the present invention;

FIG. 2 is a side view of a schematic of a multi-layer circuitry in accordance with the present invention;

FIG. 3 is a view through 3—3 of FIG. 2;

FIG. 4 is a view through 4—4 of FIG. 2;

Figure 5:
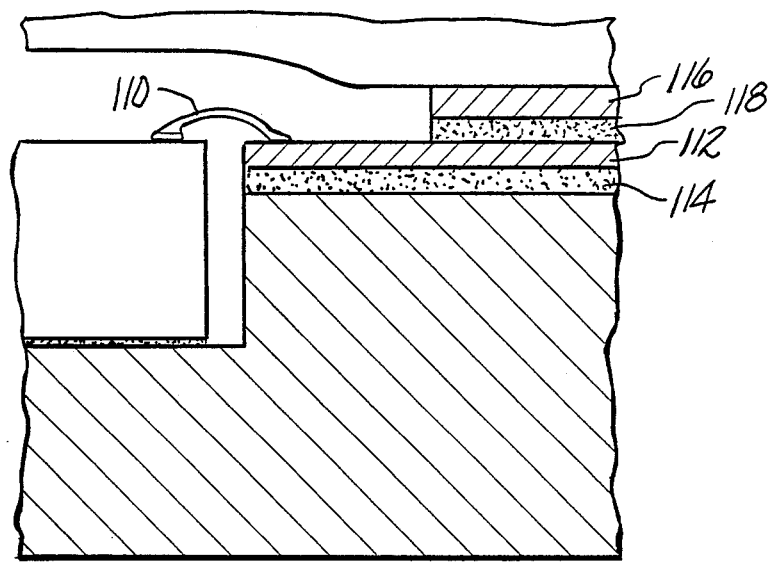
FIG. 5 is a side view in cross section of a second embodiment of multi-layer circuitry in accordance with the present invention.

Referring to FIGS. 1-3, there is illustrated multi-layer circuitry 10 incorporating electronic elements 12-16. The circuitry comprises a plurality of layers 18-24 which includes a metal or alloy substrate 24. The substrate is formed with a recess 26 (exaggerated in size for emphasis) on one surface 28. An electronic element 12 is positioned within the recess and a second electronic element 14 is positioned substantially on the surface. Also, a first dielectric material layer 30 is disposed on the surface 28. Further, a first layered conductive circuit pattern 32 overlies the first dielectric material layer so as to provide circuitry over a substantial portion of the substrate 24. The first circuit pattern 32 is electrically connected to the first electronic element 12. The first circuit pattern also has a cavity 36 therein for receiving the second electronic element 14. A second layered conductive circuit pattern 38 overlies at least a portion of the first layered conductive circuit pattern 32 and the second electronic element 14 and is electrically connected to the second electronic element. A second dielectric material layer 40 is disposed between the first and second layered conductive circuit patterns 32 and 38 whereby these circuit patterns are bonded to and isolated from each other.

Referring to FIG. 1, a solid metal or alloy substrate 24 has been provided. This substrate serves the two primary functions of firstly providing mechanical support for chips 12-16 and being metal, high thermal conductivity. Preferred metals or alloys for the substrate as well as other parts of the system, including the cover and circuit pattern layers are copper and high conductivity copper alloys so as to optimize heat dissipation.

Another important criteria for choosing the metal or alloy is its ability to bond to the particular dielectric layer. In accordance with this invention, it has been found that copper and copper base alloys, capable of forming a refractory oxide layer, provide very strong bonds with different dielectric films including adhesives, solder glass or ceramic films as required. Suitable copper base alloys for use in the present invention contain from 2 to 12% aluminum. In particular, CDA alloy 638, as disclosed in U.S. Pat. No. 3,676,292 to Pryor et al., containing 2.5 to 3.1% aluminum, 1.5 to 2.1% silicon, and 0.25 to 0.55% cobalt is most useful in the provision of a metal in accordance with this invention. Impurities may be present which do not prevent bonding in a desired environment. Further, it may be desirable to use CDA alloy 6381, as disclosed in U.S. Pat. No. 3,341,369 to Caule et al. Alloy C6381 is similar to alloy C638 except for the omission of cobalt. This omission reduces cost and entails some reduction in annealed mechanical properties.

The alloys useful with this invention and, especially alloy C638 or C6381, may have a refractory oxide layer applied to the surface which is in contact with the dielectric layer. The oxide layer may include complex oxides formed with elements such as alumina, silica, tin, iron chromia, zinc, and manganese. Most preferably, the refractory oxide layer is substantially aluminum oxide ($Al_2O_3$) This refractory oxide may be applied to the substrate in any desired manner. For example, a copper base alloy such as alloy C638 is preoxidized in gases having an extremely low oxygen content. The alloy C638 may be placed in a container with 4% hydrogen and 96% nitrogen and a trace of oxygen released from a trace of water mixed in the gas. This gas may be heated to a temperature of between about 330° C. and about 820° C. Depending on the temperature and amount of time the alloy is left in the heated gas, a refractory oxide layer of a desired thickness forms on the surface of the alloy. It is also within the scope of the invention to apply the refractory oxide layer to the entire surface of each element being treated.

The present invention is not restricted to applications of alloy C6381 but may include the broad field of metals or alloys which have the ability to form continuous refractory oxide layers on their surface. Several examples of other metal alloys, such as nickel base and iron base alloys, are disclosed in U.S. Pat. Nos. 3,698,964, 3,730,779 and 3,810,754. The copper or copper base alloy component may also include composite metals in which the refractory oxide forming metal or alloy is clad upon another metal by any conventional technique. This other metal may be another copper alloy or any other metal whose bulk properties are desired for a specific application such as high thermal conductivity.

FIGS. 1, 3 and 4 illustrate a system in which the second interconnection to chips 12, 14, or 16 is provided by means of tape bonding. Tape bonding is a conventional technique for providing the second level interconnection to the chip. A foil 50, typically approximately one ounce (0.0014" thick) printed circuit foil, is mounted upon a dielectric carrier film 52 with a "window" in the film so that the central portion 54 of the copper is exposed on both sides 56 and 58. A "spider" pattern 59 of leads or "wires" is etched into the copper foil 50, fanning out from the center with the center tips of the pattern being positioned and arranged to mate with the bonding pads 60 on the surface 62 of the chip. These tips are within the window area so that both sides of the foil are exposed. The spider is placed upon the chip and is bonded to the pads on the chip by the application of heat and pressure, often assisted with the simultaneous application of ultrasonic energy. Conventional single packaged semiconductor devices have the fanned out leads or "wires" which are bonded to a lead frame, whereas the present invention also eliminates the lead frame as described hereinbelow. In effect, the "spider" replaces the multiplicity of lead wires used in the wire bonding technique.

There are two primary advantages associated with tape bonding. Firstly, instead of having to bond each individual wire individually to both the chip and the lead frame, they may all be bound simultaneously. Secondly, in order to provide sufficient space for wire bonding, the pad on the chip must be wide enough to accommodate the flattened dimensions of the lead wire plus other tolerances required in the bonding operation. In chips with many interconnections, the space available for bonding pads may be insufficient to permit wire bonding unless two or even more rows of bonding pads are placed around the periphery of the chip. These additional rows may cause an undesirable increase in the chip size. In contrast, tape bonding makes it possible to reduce the size of the pad.

It will be noted that the bonding area 60 on the chip 12 as shown in FIG. 1 projects upward from the outer surface 62 of the chip 12 as a bump. This is customary in tape bonding since the metal portion 54 must be separated from the corner of the chip by enough space so as to avoid short-circuiting against the edge of the chip if the conductor 50 were to sag. There is an alternative tape bonding method in which the conductor is provided with a bump (so called "bumped tape") to eliminate the need for a bump on the chip. It is within the scope of the present invention to use either procedure for the system as illustrated in the figures.

It will be noted that the chip 12 in FIG. 1 is mounted within a recess 26 in the metal substrate such that the plane of the bump on the chip corresponds to the plane of the bottom surface of conductor 50. As described above, the tape 50 is mounted on a dielectric film 52. The tape may have the dielectric film applied to only one side and if desired, a second layer of dielectric film 30 applied to the other side of the tape after the pattern has been etched in the copper foil. The tape 50 may have either dielectric layer 30 or layer 52 or both constituting the dielectric layer originally applied to the tape. If the dielectric layer 52 is originally applied to the tape 50, then layer 30 is a separate dielectric layer applied as a continuous layer to the substrate 24.

After the tape and the continuous dielectric layers 30 and 52 have been mounted on the substrate and bonded to the chip, a printed circuit 32 is bonded to the substrate/chip/spider subassembly. This layered conductive printed circuit pattern 32 may contain one or more conductive layers mounted upon a suitable dielectric 64 with the desired circuit pattern having been etched into the conductor layer or layers. FIG. 1 illustrates a two layer printed circuit board 32 having a dielectric film 70, typically used in flexible printed circuits, separating the copper foil layers 72 and 74. One layer of copper foil is laminated to each side of the dielectric film 70 and subsequently, suitable circuitry is etched in the copper layers. Interconnections between the layers may be provided as shown in FIG. 1 and described hereinbelow. Depending upon the complexity of the circuitry required, the scope of the invention includes the use of a single conductor layer circuit or three or more conductor layers.

The dielectric films of the present invention may be constructed of high strength plastic materials such as polyimide (Kapton). This material is quite desirable as it may be thin (about 0.001" thick), temperature resistant, of a high strength and useful in certain flexible circuit applications. It is within the scope of the invention to use a thicker dielectric film which simply results in an increase in the thickness of the system.

Alternatively, the present invention may use any suitable solder glass or ceramic component for the dielectric layers. Preferably, the glass or ceramic component has a coefficient of thermal expansion/contraction which closely matches the metal components. The glass is bonded to thin refractory oxide layers formed on the surface of the metal or alloy components, as described above, and functions to adhere the metal or alloy components together and to electrically insulate them from each other. When the glass and the copper alloy substrates preferably have the same or closely matched coefficients of thermal expansion, thermal stresses in the system may be essentially eliminated and the problems associated with thermal stress in the finished product alleviated. However, the specific character of the refractory oxide layer present on the preferred alloys C638 or C6381 allows bonding to solder glasses with significantly lower expansion/contraction coefficients than that of the alloy. It has been demonstrated that mechanically sound bonds can be achieved between C638 (coefficient of thermal expansion $170 \times 10^{-7}$ in./in./°C.) and CV432 (contraction coefficient of $127 \times 10^{-7}$ °C.).

Table I lists various exemplary solder glasses which are adapted for use in accordance with this invention.

TABEE I

| Solder Glass or Ceramic Type | Coefficient of Thermal Expansion, in./in./°C. |
| --- | --- |
| Ferro Corp.[1] No. RN-3066-H | $167 \times 10^{-7}$ |
| Ferro Corp.[1] No. RN-3066-S | $160 \times 10^{-7}$ |
| Owens Illinois[2] No. EJ3 | $160 \times 10^{-7}$ |
| Owens Illinois[2] No. CV432 | $127 \times 10^{-7}$ |

[1]Proprietary composition manufactured by Ferro Corporation, Cleveland, Ohio.
[2]Proprietary composition manufactured by Owens Illinois Corporation, Toledo, Ohio.

FIG. 1 illustrates one means of connecting the layers 87 and 89 of the printed circuit 32 to the conductor tape 50. This is accomplished by means of a through-hole connection 80 of the type normally used for interconnecting two layers in a printed circuit. A metal or alloy pad area 82, generally of circular configuration, is provided on or between the layers to be interconnected. In addition to pad area 82 which may be a portion of copper foil circuit layer 83, the layers 87 and 89 can also be considered to include pad areas within the scope of this invention. A hole is drilled (or otherwise pierced) through the pad areas and the dielectric. This hole may be lined with a copper barrel 84 formed by electroless deposition of the copper. The barrel creates a continuous current path between the circuit board 32 and layer 50. The circular pads in the layers 87 and 89 are simply an extension of the conductor paths. Conventionally, solder is used to bond two or more copper elements, i.e. bonding layer 50 to the circular pad in layer 83. This may be conveniently accomplished by solder coating the surface of the circular pad 82 and/or the matching area in layer 50. During assembly, pad 82 would be placed in contact with its matching area in layer 50. Then, the solder is reflowed by the application of heat and normally by some application of pressure. Surplus solder 86 can flow up into the barrel 84 as shown.

Referring to FIG. 3, there is illustrated a top cross-sectional view through the layered conductive circuit pattern 18. The layers 72 and 74 preferably provide circuitry which may be connected to either side of the chip surface 62 as seen in FIG. 3. This circuitry may also be connected by through-hole connections 80. Generally, the circuitry which is connected to the left side of the TAB spider 50, is intended to be directed in the direction of circuitry 85 to the right of chip 12 as illustrated. Preferably, the circuitry incorporates circuit layers 72 and 74 across the top of the area occupied by chip 12 as seen in FIG. 2. Thus, the plan area in this system which is occupied by the mounted chips may also, in a different layer, be used to accommodate circuitry. The circuitry 85 incorporates circuit layers 87 and 89.

An example of the circuitry is described to better understand the present invention.

The inner tips of the spider, where they bond to the pads or bumps on the semiconductor chip, and the space between these individual fingers may be as narrow as about 0.003". The wires represented by the fingers may thereby be spaced on approximately 0.006" centers. Although the present state of the art printed circuits provide for minimum wire widths of 0.003" and minimum space between wires of 0.003", 0.005" wires and spacings are more common. However, the pad areas 82 required for through-hole connections, such as shown in FIG. 1, are considerably larger than 0.003" or 0.005". Hence, the conductor pattern must fan out from the chip so as to provide wider spacing for through-hole connections. After these connections have been established, the wires can be brought back into close proximity and their width reduced.

Since an enlarged circuit area is only needed locally where interlayer through-hole connections are being made, a system configuration as shown in FIGS. 2-4 is advantageous. As shown in FIG. 3, the first layer of circuitry 32 occupies a relatively wide width in the general vicinity of chip 12 but can be constricted in width so as to pass on either side of chips 14, 16 or any additional chips which may be along the same axis in the system. An electronic element or chip 14 may be mounted on a plane above electronic element 12 and electronic element or chip 16 may be mounted on a plane above chip 14, etc. The circuit layer, i.e. 20 or 22, as it passes by the next chip 14 or 16 respectively, is designed to be substantially flush with the top surface of that chip. Then, the circuit layer which serves the second chip may be mounted to the second chip in the same manner as shown in FIG. 1 and the second layer of circuitry 38 is bonded by dielectric 40 to the top surface of element layer 32. Chip 16 may be elevated still more so that its top is flush with the top of the circuitry 38 serving chips 12 and 14, etc. To provide for these different heights, chip 12 is mounted in a recess 26 on the substrate; chip 14 is mounted substantially flush with the surface 28 of the substrate; and chip 16 is mounted on a metal pedestal 96 previously soldered or brazed to the substrate. If the circuitry associated with the chips is thinner or thicker, the depth of recesses or the height of pedestals may be varied to suit.

The volume and area, not used for the basic interconnections, may optionally be used for auxiliary circuits, other interconnections and other components. Although not shown in the sketch, other components can also be mounted upon the substrate and interconnected as desired through the multiple layers of circuitry provided.

One of the advantages of the system shown is that all chips (and optionally other heat generating components) are mounted directly upon a conductive metal substrate 24 which may provide excellent heat dissipation. Since the system provides for extremely dense mounting of the semiconductor chips, still greater heat dissipation than by conduction through the metal substrate may be required. In such event, the outer surfaces of the substrates are available for application of fins, cooling or refrigerant passages, heat pipes or other auxiliary cooling devices. As indicated previously, substrate thickness and material may be varied to suit heat dissipation requirements.

After assembly has been completed, a protective cover 100 may be applied to the entire system. This cover may be of any desired material and in any thickness required to provide adequate protection to the system.

FIG. 3 illustrates single rows of chips on a substrate. It is, however, within the scope of the present invention to provide two or more parallel rows. Also, the chips may be of different sizes and types.

FIG. 4 illustrates the cavity 97 in layer 20 which accommodates the pedestal 96 and the chip 16. Of course, it is within the scope of the present invention to modify the shape of the cavity 97 to accommodate any number of chips of desired configurations.

As shown in FIG. 1, chips are preferably connected to the circuitry through the means of a TAB tape. There is no lead frame and this level of interconnection has been eliminated. As an alternative, conventional wire bonding may be substituted for tape bonding as illustrated in FIG. 5. In that embodiment, the wire 110 is bonded to a foil layer 112. The foil layer may be etched to form a circuit similar to the TAB of FIG. 1. The foil layer 112 is bonded to the substrate with a dielectric layer 114. Also, a circuit board 116 may be bonded to foil 112 by means of a dielectric layer 118. The foil layers 112 and 116 may be interconnected as shown in FIG. 1.

Figure 6:
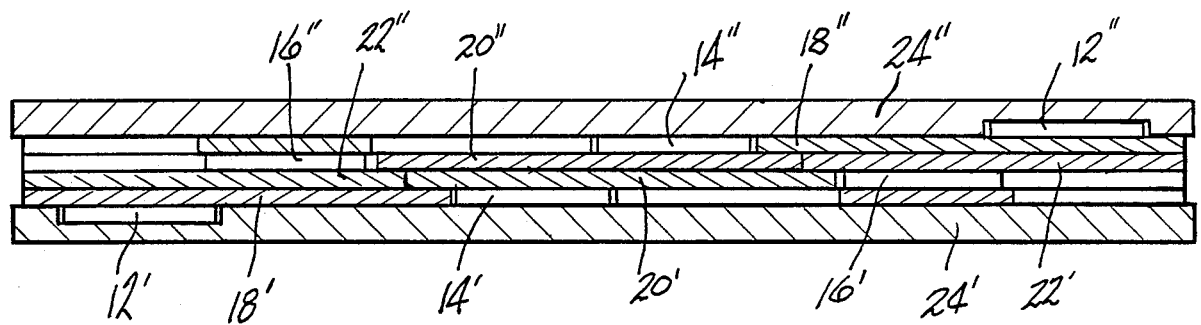
FIG. 6 is a side view of a schematic of two packages of multi-layer circuitry bonded together.

Another option as shown in FIG. 6 is to place two assemblies of the type shown in FIG. 2 face to face such that the two solid metal substrates become both outside surfaces. The numbers of the components have been primed and double primed to indicate their similarity to the components of FIG. 2.

As mentioned above, the dielectric may be either a plastic or ceramic. Systems in which the circuitry has been plastic mounted are probably not hermetic.

A nearer approach to hermeticity may be obtained by using a dielectric coated metal as the top cover 100. Then, unwanted contaminants may only be introduced into the package edgewise through the exposed organic dielectric layers. The exposure may be at a minimum since these paths are relatively thin. If desired, hydroscopic materials may be incorporated within recesses in the cover. Also, materials such as activated carbon may be incorporated in these recesses to absorb water vapor and other contaminants, respectively.

A still closer approach to hermeticity may be obtained by soldering or brazing metal sheets around the periphery of the system to seal all areas except those through which external leads from the system emerge. Full hermeticity may be obtained by connecting the leads to the exterior through glass-to-metal seals. Preferably, the cover sheets can be formed of copper alloy 638/6381 which has an effective bond with a suitable glass so as to provide sealed leads.

Alternatively, glass may be substituted in the system for organic dielectrics and C638 or C6381 may be used as the conductors in printed circuits (which are now glass insulated) or C638/C6381 clad upon a suitable higher conductivity copper alloy, such as 151, may be used for substrate and conductors in order to maintain high electrical and thermal conductivity.

The patents and patent applications set forth in this application are intended to be incorporated by reference herein.

It is apparent that there has been provided in accordance with this invention a multi-layer circuitry and a system of mounting electronic elements within the circuitry which satisfy the objects, means, and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. Multi-layer circuitry adapted to incorporate electronic elements, comprising:

a metal or alloy substrate, said substrate formed with at least a first recess extending from a surface thereof, said substrate further adapted to receive at least a first electronic element within said recess and to support at least a second electronic element on said surface;

a first dielectric material layer bonded to said surface of said substrate;

a first layered metal or alloy conductive circuit pattern means overlying and bonded to said first dielectric material layer to provide circuitry adapted to be electrically connected to said at least first electronic element, said first circuit pattern means further having at least a first cavity therein adapted for receiving said at least a second electronic element;

a second layered metal or alloy conductive circuit pattern means overlying at least a portion of said first layered metal or alloy conductive circuit pattern means and said at least a second electronic element adapted for electrical connection to said at least a second electronic element;

a second dielectric material layer disposed between said first and second metal or alloy layered conductive circuit pattern means for bonding said first and second circuit pattern means to each other and electrically insulating them from each other, and said first and second dielectric material layers comprising a first glass or ceramic component having a coefficient of thermal expansion of at least about $160 \times 10^{-7}$ in/in/°C., said coefficient of thermal expansion of said glass or ceramic being closely matched to the coefficient of thermal expansion of said metal or alloy substrate, said first metal or alloy conductive circuit pattern means and said second metal or alloy conductive circuit pattern means.

2. The circuitry of claim 1 wherein said second layered conductive circuit pattern means has at least a second cavity therein, and further including a metal or alloy pedestal positioned within said first cavity and under said second cavity and affixed to said substrate, whereby said second cavity is adapted to receive a third electronic element supported by said pedestal.

3. The circuitry of claim 2 further including a third layered metal or alloy conductive circuit pattern means overlying said second layered conductive circuit pattern means and said pedestal, said third circuit pattern means adapted to be electrically connected to said at least a third electronic element, and a third dielectric material layer disposed between said second and third layered metal or alloy conductive pattern means whereby said second and third metal or alloy circuit pattern means are bonded to and electrically insulated from each other, said third dielectric layer comprising said first glass or ceramic component having a coefficient of thermal expansion of at least about $160 \times 10^{-7}$ in/in/°C., said coefficient of thermal expansion of said glass or ceramic being closely matched to the coefficient of thermal expansion of said metal or alloy substrate, said first metal or alloy conductive circuit pattern means, and said third metal or alloy conductive circuit pattern means.

4. The circuitry of claim 3 wherein said first layered conductive circuit pattern means includes:

a first metal or alloy foil adapted to be electrically connected to said first electronic element;

a first metal or alloy printed circuit component;

a first intermediate dielectric material layer interposed between and bonded to said first metal or alloy foil and said first metal or alloy printed circuit component whereby said first foil and said first circuit component are electrically insulated from each other; and means for electrically connecting said first foil to said first printed circuit component.

5. The circuitry of claim 4 wherein said second layered conductive circuit pattern means includes:

a second metal or alloy foil adapted to be electrically connected to said second electronic element;

a second metal or alloy printed circuit component;

a second intermediate dielectric material layer interposed between and bonded to said second metal or alloy foil and said second metal or alloy printed circuit component whereby said second foil and said second circuit component are electrically insulated from each other; and means for electrically connecting said second foil to said second printed circuit component.

6. The circuitry of claim 5 wherein said third layered conductive circuit pattern means includes:

a third metal or alloy foil adapted to be electrically connected to said third electronic element;

a third metal or alloy printed circuit component;

a third intermediate dielectric material layer interposed between and bonded to said third metal or alloy foil and said third metal or alloy printed circuit component whereby said third foil and said third circuit component are electrically insulated from each other; and means for electrically connecting said third foil to said third printed circuit component.

7. The circuitry of claim 6 wherein said first, second, and third intermediate dielectric material layers comprise a second glass or ceramic component which is substantially the same as said first glass or ceramic component.

8. The circuitry of claim 7 wherein said alloy substrate, said first, second, and third alloy printed circuit components, and said first, second, and third alloy foils comprise a copper alloy having a coefficient of thermal expansion of about $170 \times 10^{-7}$ in/in/°C. and comprising an effective amount of up to 12% aluminum to form a refractory oxide and the balance essentially copper.

9. The circuitry of claim 8 wherein said copper alloy further comprises 2 to 10% aluminum, 0.001 to 3% silicon and the balance essentially copper.

10. The circuitry of claim 9 wherein said copper alloy consist essentially of:

2.5 to 3.1% aluminum, 1.5 to 2.1% silicon and the balance essentially copper.

11. The circuitry of claim 8 wherein said alloy substrate, alloy printed circuit components and alloy foils have a refractor oxide layer including $Al_2O_3$ for bonding the substrate, printed circuit alloy components or alloy foils to the first and second glass or ceramic components.

12. The circuitry of claim 6 wherein said means for connecting said first, second, and third foils to said first, second, and third circuit components, respectively, includes one or more through-holes lined with a conductive material extending between said foils.

13. The circuitry of claim 12 wherein said first, second and third foils each have a lead pattern etched therein and adapted for connection to said first, second or third electronic elements, respectively.

14. The circuitry of claim 13 further including a cover plate means for covering said first, second, and third layered conductive pattern means.

15. Multi-layer circuitry adapted to incorporate electronic elements, comprising:

a metal or alloy substrate having a first refractory oxide layer on at least one surface thereof, said substrate formed with at least a first recess extending from said surface, said substrate further adapted to receive at least a first electronic element within said recess and to support at least a second electronic element on said surface;

a first layered metal or alloy conductive circuit pattern means having a second refractory oxide layer on first and second oppositely disposed surfaces thereof, said first circuit pattern means overlying said substrate to provide circuitry adapted to be electrically connected to said at least first electronic element, said first circuit pattern means further having at least a first cavity therein adapted for receiving said at least a second electronic element;

a first dielectric material layer disposed between said substrate and said first circuit pattern means for bonding to said first and second refractory oxide layers;

a second layered metal or alloy conductive circuit pattern means having a third refractory oxide layer on at least a first surface thereof, said second circuit pattern means overlying at least a portion of said first layered metal or alloy conductive circuit pattern means and being adapted for electrical connection to said at least a second electronic element;

a second dielectric material layer disposed between said first and second metal or alloy layered conductive circuit pattern means for bonding second and third refractory oxide layers and electrically insulating said first and second circuit pattern means from each other, and said first and second dielectric material layers comprising a first glass or ceramic component having a coefficient of thermal expansion of at least about $160 \times 10^{-7}$ in/in/°C., said coefficient of thermal expansion of said glass or ceramic being closely matched to the coefficient of thermal expansion of said metal or alloy substrate, said first metal or alloy conductive circuit pattern means and said second metal or alloy conductive circuit pattern means.

* * * * *